(12) United States Patent
Black, Jr. et al.

(10) Patent No.: US 6,252,390 B1
(45) Date of Patent: Jun. 26, 2001

(54) MAGNETICALLY COUPLED SIGNAL ISOLATOR

(75) Inventors: William C. Black, Jr., Ames, IA (US); Theodore M. Hermann, Eden Prairie, MN (US)

(73) Assignee: Nonvolatile Electronics, Incorporated, Eden Prairie, MN (US)

( * ) Notice: Subject to any disclaimer, the term of this patent is extended or adjusted under 35 U.S.C. 154(b) by 0 days.

(21) Appl. No.: 09/153,665

(22) Filed: Sep. 15, 1998

Related U.S. Application Data

(62) Division of application No. 08/698,903, filed on Aug. 16, 1996, now Pat. No. 5,831,426.

(51) Int. Cl.[7] .................................................. G01R 33/00
(52) U.S. Cl. ........................................ 324/127; 324/117 R
(58) Field of Search .......................... 324/117 H, 117 R, 324/127, 252; 338/32 R; 257/421, 427; 327/510

(56) References Cited

U.S. PATENT DOCUMENTS

| 4,075,671 | 2/1978 | Cheatham et al. ................... 324/252 |
| 4,097,802 | 6/1978 | Mahopac ................................ 324/252 |
| 4,414,510 | 11/1983 | Milkovic ................................ 324/252 |
| 4,464,629 | 8/1984 | Tanaka et al. ...................... 324/117 H |
| 4,520,311 | 5/1985 | Petr et al. .......................... 324/117 R |
| 4,596,950 | 6/1986 | Lienhard et al. .................. 324/117 R |
| 4,603,365 | * 7/1986 | Nakamura ............................... 362/55 |
| 4,754,219 | 6/1988 | Milkovic .............................. 324/142 |
| 5,005,064 | 4/1991 | Yoshino et al. ....................... 357/27 |
| 5,119,025 | 6/1992 | Smith et al. ......................... 324/252 |
| 5,122,227 | 6/1992 | Ott ..................................... 156/659.1 |
| 5,247,278 | 9/1993 | Pant et al. .......................... 338/32 R |
| 5,260,653 | 11/1993 | Smith et al. ......................... 324/252 |
| 5,302,461 | 4/1994 | Anthony ................................ 428/472 |
| 5,313,186 | 5/1994 | Schuhl et al. ....................... 338/32 R |
| 5,329,413 | 7/1994 | Kondoh et al. ....................... 360/113 |
| 5,399,965 | 3/1995 | Heberle ............................. 324/117 H |
| 5,512,818 | 4/1996 | Jin et al. ............................ 323/368 |
| 5,561,366 | 10/1996 | Takahashi et al. ............... 324/117 R |
| 5,561,368 | 10/1996 | Dovek et al. ......................... 324/252 |
| 5,585,719 | * 12/1996 | Endo et al. .......................... 324/235 |
| 5,617,071 | * 4/1997 | Daughton .......................... 338/32 R |
| 5,636,159 | 6/1997 | Pohm .................................. 365/158 |
| 5,982,176 | * 11/1999 | Kawamura et al. ................ 324/252 |

* cited by examiner

Primary Examiner—Ernest Karlsen
Assistant Examiner—Russell M. Kobert
(74) Attorney, Agent, or Firm—Kinney & Lange, P.A.

(57) ABSTRACT

A current determiner having an output at which representations of input currents are provided having an input conductor for the input current and a current sensor supported on a substrate electrically isolated from one another but with the sensor positioned in the magnetic fields arising about the input conductor due to any input currents. The sensor extends along the substrate in a direction primarily perpendicular to the extent of the input conductor and is formed of at least a pair of thin-film ferromagnetic layers separated by a non-magnetic conductive layer. The sensor can be electrically connected to electronic circuitry formed in the substrate including a nonlinearity adaptation circuit to provide representations of the input currents of increased accuracy despite nonlinearities in the current sensor, and can include further current sensors in bridge circuits.

25 Claims, 8 Drawing Sheets

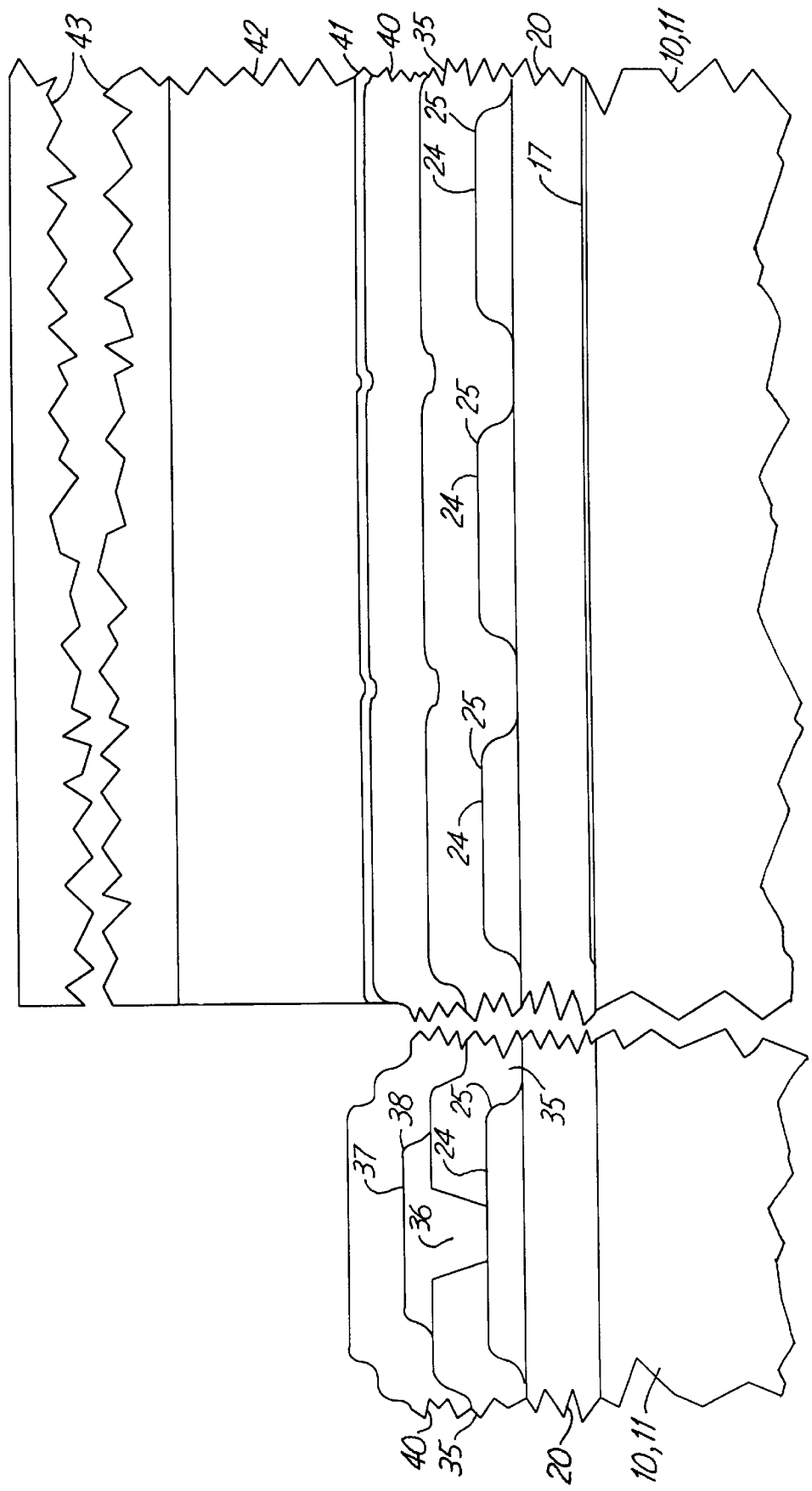

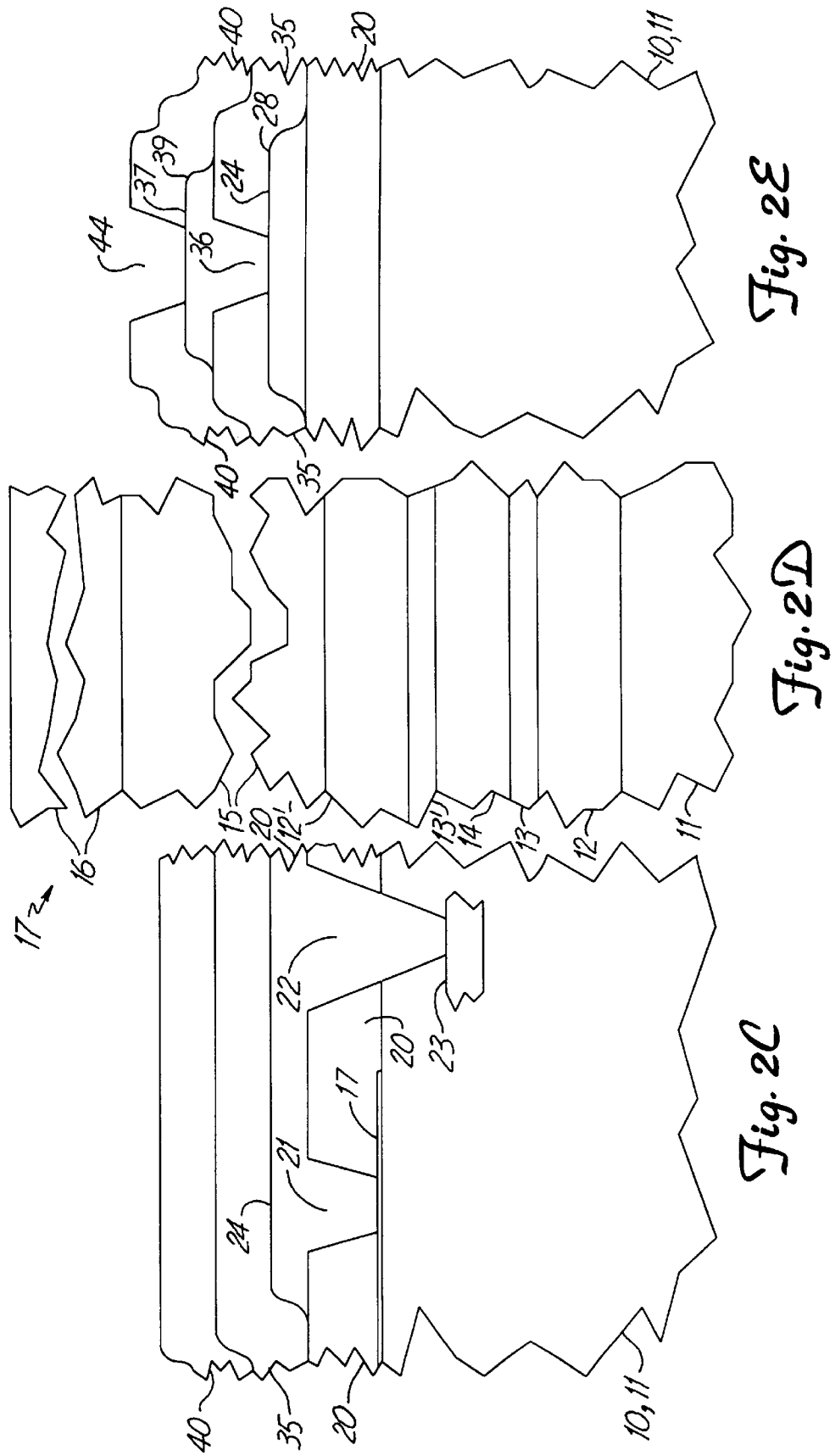

MAGNETICALLY COUPLED SIGNAL ISOLATOR

CROSS REFERENCE TO RELATED APPLICATION

This application is a division of application Ser. No. 08/698,903, filed Aug. 16, 1996, now U.S. Pat. No. 5,831,426 entitled "Magnetic Current Sensor."

This invention was made with government support under Contract No. NASW-4984 awarded by NASA. The government has certain rights in this invention.

BACKGROUND OF THE INVENTION

The present invention relates to ferromagnetic thin-film structures exhibiting relatively large magnetoresistive characteristics and, more particularly, to such structures used to sense magnetic fields.

Many kinds of electronic systems make use of magnetic devices including both digital systems, such as memories, and analog systems such as field sensors. Magnetometers and other magnetic sensing devices are used extensively in many kinds of systems including magnetic disk memories and magnetic tape storage systems of various kinds. Such devices provide output signals representing the magnetic field sensed thereby in a variety of situations.

One use for such magnetic field sensors is the sensing of magnetic fields generated by electrical currents in a conductor as a basis for inferring the nature of such current giving rise to these fields. While this has long been done for magnetic fields generated by substantial currents, such sensing becomes more difficult to accomplish in lesser ranges of currents that include relatively small currents. The need for sensing fields due to such small currents arises, for instance, in situations where the currents generating the fields to be measured are provided merely as a basis for conveying signal information rather than for transmitting substantial electrical energy.

Such a situation occurs in many medical systems, instrumentation systems and control systems where there is often a need to communicate signals to system portions over signal interconnections from an external source or from another portion of the system. Often, the conductors carrying signal currents for such purposes must be electrically isolated from the portion of the system containing the sensor arrangement for those signals to measure the resulting magnetic fields. As an example, a long current loop carrying signal information in the loop current may, through lightning or static electricity discharges, become subject to having large voltage potentials relative to ground developed thereon. Such potentials must in many instances be kept from the signal sensing and receiving circuitry to avoid damage thereto even though that circuitry must still be able to capture the signal information contained in the loop current.

Signal isolators for these purposes are often preferably formed in monolithic integrated circuit chips for reasons of cost, convenience and system performance. In such an arrangement, one or more solid state magnetic field sensors are used to detect the magnetic fields provided by the currents containing the signals. A kind of magnetic field sensor which has been used in this situation is a Hall effect device. Such devices are often not satisfactory for sensing the magnetic fields due to small currents because of the limited sensitivity they exhibit with respect to magnetic fields.

Furthermore, there is often a lack of satisfactory remedial or supplementary measures in such arrangements for improving the limited sensitivity of Hall effect devices. The use of field concentrators is difficult to provide in a monolithic integrated circuit containing a Hall device because of the magnetically sensitive axis of that device being perpendicular to the directions the Hall device in the monolithic integrated circuit extends over the substrate supporting that device, i.e. the device axis of sensitivity is parallel to the thickness of the device rather than to the width or length thereof. Also information provided by Hall devices as to the magnetic fields measured thereby is in the form of a voltage which limits the use of such devices in bridge circuits which might otherwise be used for purposes of increasing the output signal providing the current signal information.

Another possibility in either hybrid integrated circuits or monolithic integrated circuits for signal isolation is the use of a light source having its electromagnetic radiation intensities controlled by signal currents from a signal source. Such a light source is electrically isolated from a light detector provided in the integrated circuit that is used to infer the nature of the signal currents from the light transmitted to and received thereby. Difficult engineering and economic problems make this an unsatisfactory solution as they do various alternative capacitance based coupling solutions. Thus, there is a need for a signal isolation device exhibiting relatively high sensitivity which can be fabricated at a reasonably economic cost.

SUMMARY OF THE INVENTION

The present invention provides a current determiner having an output at which representations of input currents are provided for input currents that are supplied from a source, the current determiner comprising an input conductor and a first current sensor both supported on a substrate adjacent to and spaced apart from one another so they are electrically isolated with the first current sensor positioned in those magnetic fields arising from any input currents. The first current sensor is formed of a plurality of magnetoresistive, anisotropic, ferromagnetic thin-film layers at least two of which are separated from one another by a non-magnetic, electrically conductive layer positioned therebetween.

This first current sensor extends primarily along a first direction across the substrate and the input conductor extends primarily along a second direction across the substrate which is approximately orthogonal to the first direction. A layer of material exhibiting a substantial magnetic permeability can be used therewith positioned near both the input conductor and the first current sensor to serve as a magnetic field concentrator and as a shield against any unwanted external magnetic fields.

This sensor can be electrically connected to other electronic circuitry formed in the substrate. Such circuitry can include a nonlinearity adaptation circuit to provide more accurate representations of the input currents despite nonlinearities in the current sensor. Further current sensors also adjacent the input conductor or an output conductor can be provided to form bridge circuits to increase sensitivity.

BRIEF DESCRIPTION OF THE DRAWINGS

FIGS. 2A, 2B, 2C, 2D and 2E represent layer diagrams of parts of the structure portion shown in FIG. 1.

DETAILED DESCRIPTION OF THE PREFERRED EMBODIMENTS

Magnetic field sensors for such signal isolators, based on magnetoresistive sensing of magnetic conditions occurring therein, can be advantageously fabricated using ferromagnetic thin-film materials. Such devices may be provided on a surface of a monolithic integrated circuit to thereby allow providing convenient electrical connections between the sensor device and the operating circuitry therefor.

In the recent past, providing such sensors in the form of an intermediate thin layer of a separating material having two major surfaces on each of which an anisotropic ferromagnetic thin-film is positioned has been found to lead to a "giant magnetoresistive effect" in the sensor if the thicknesses of the ferromagnetic thin-films and the intermediate layers in such a "sandwich" structure have been made sufficiently small in thickness. This effect can be enhanced by forming such sensors with additional alternating ones of these ferromagnetic films and intermediate layers to form superlattices. The resulting enhanced "giant magnetoresistive effect" can yield a magnetoresistive response which can be in the range of up to an order of magnitude greater than that due to the well known anisotropic magnetoresistive response. Sensors similar to those described herein for sensing magnetic fields external to those monolithic integrated structure devices containing such sensors are described in earlier filed co-pending applications by J. M. Daughton entitled "Magnetoresistive Structure With Alloy Layer" having Ser. No. 08/384,647, now U.S. Pat. No. 5,617,071, and "Magnetic Structure with Stratified Layers" having Ser. No. 08/096,765, now abandoned, by J. M. Daughton both assigned to the same assignee as the present application and hereby incorporated herein by reference.

Figure 1A:
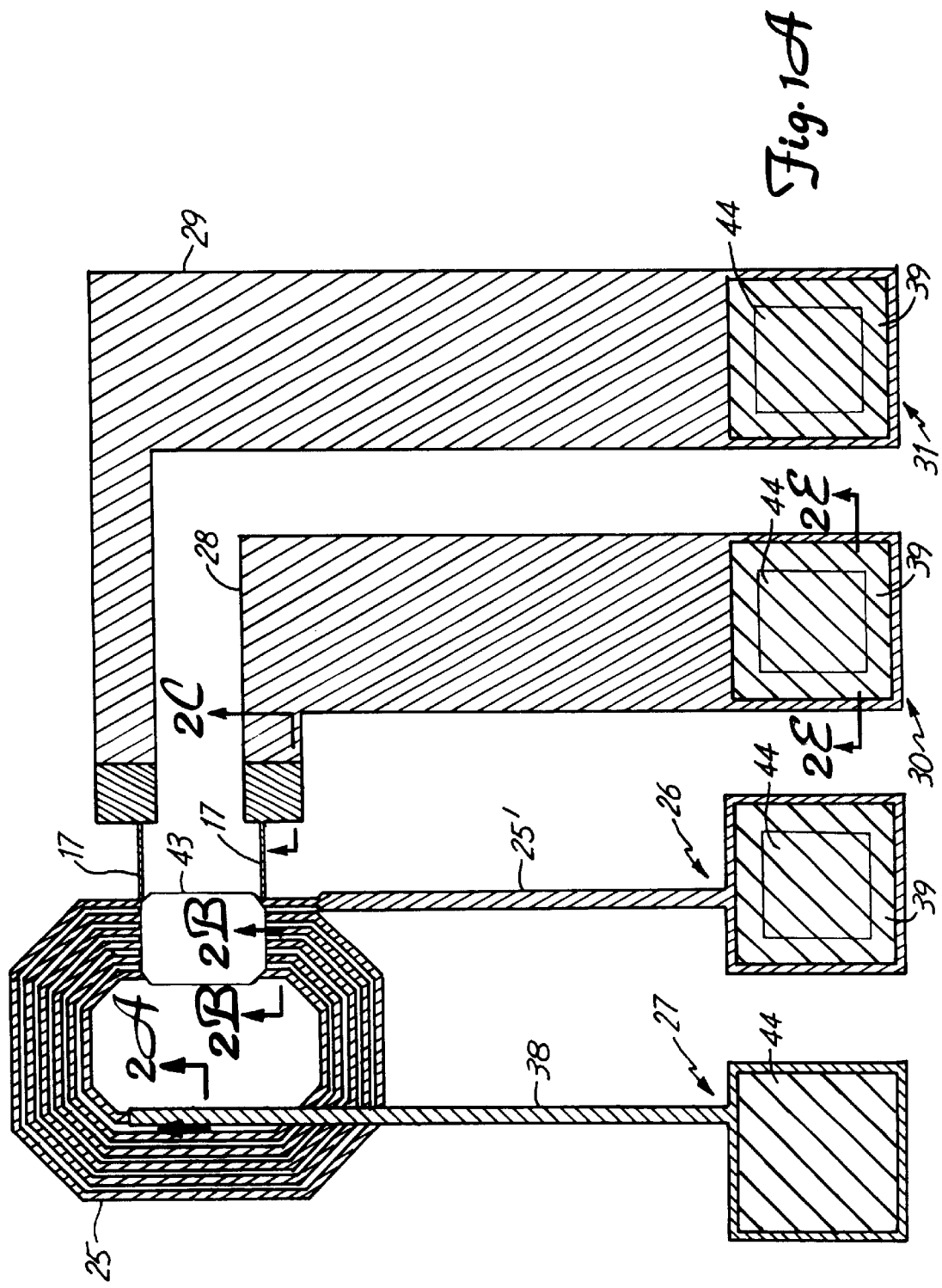
FIGS. 1A and 1B represent a plan view of a portion of a monolithic integrated circuit structure embodying the present invention.
Figure 1B:
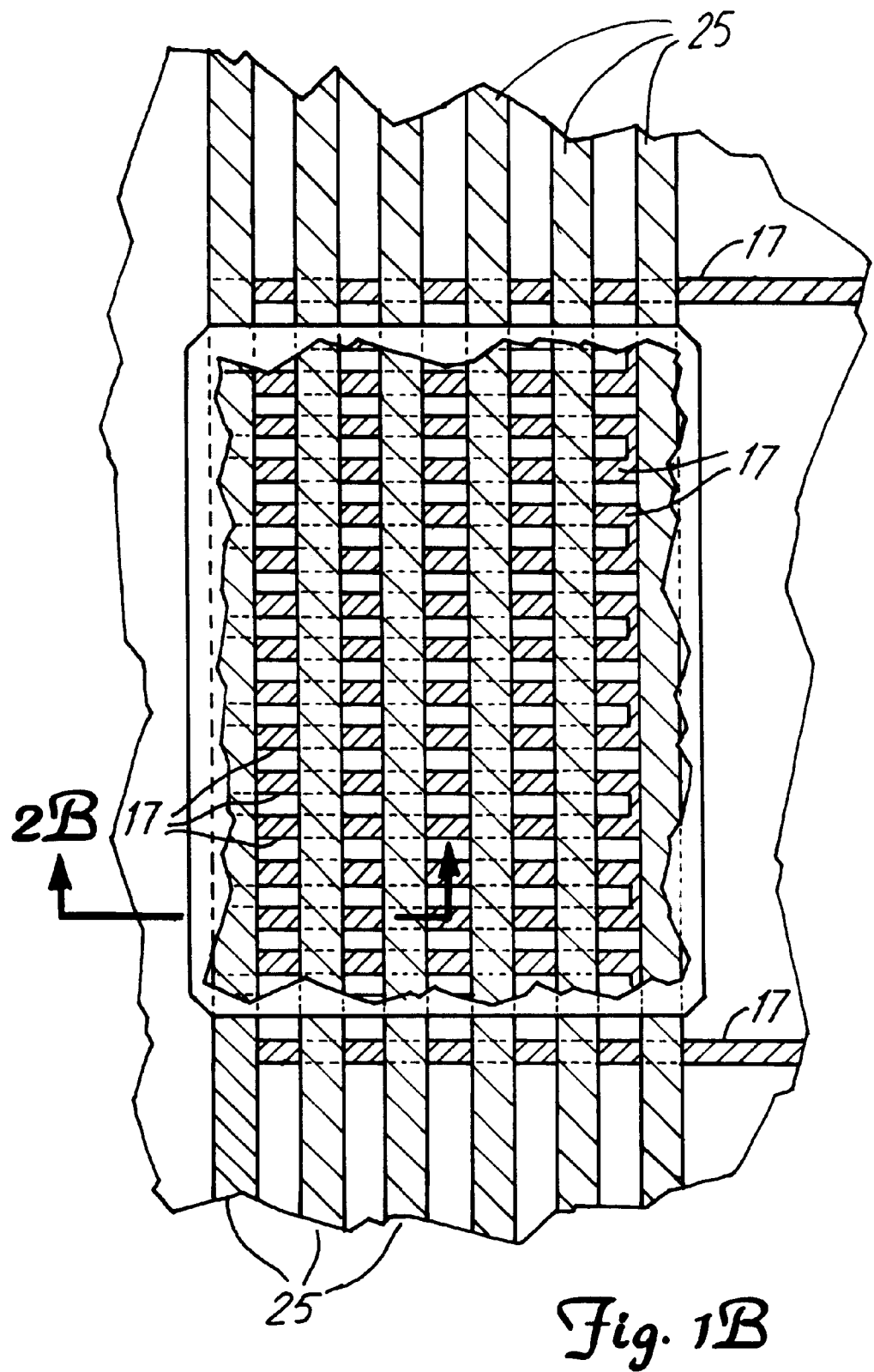

FIG. 1A shows a plan view of a signal isolator formed as a portion of a monolithic integrated circuit including a supporting semiconductor chip as part of the isolator substrate which can have conveniently provided therein the operating circuitry for this signal isolator. Alternatively, the signal isolator could be formed as part of a hybrid integrated circuit on a ceramic substrate. FIG. 1B shows a fragmentary view of a portion of the view shown in FIG. 1A enlarged for greater clarity, and also has a part thereof broken out to reveal the structure therebelow again for greater clarity. The optional protective layer that is provided over the structure shown as used has been omitted in this view for clarity as have some other layers so that the structure portions are shown in solid line form except for structure portions beneath other structure portions appearing in those figures which are shown in dashed line form.

Corresponding to FIGS. 1A and 1B are FIGS. 2A, 2B, 2C, 2D, and 2E which are layer diagrams of corresponding portions of the structures shown in FIGS. 1A and 1B as marked therein. These layer diagrams give an indication of the structural layers leading to the structures shown in FIGS. 1A and 1B but are not true cross-section views in that many dimensions are exaggerated or reduced for purposes of clarity.

As indicated above, the current sensing structure is typically provided on a semiconductor chip, 10, having suitable operating circuitry for the sensor provided therein. An electrical insulating layer, 11, formed on semiconductor chip 10 by sputter deposition of silicon nitride, supports a current sensor "sandwich" structure comprising a pair of ferromagnetic thin-film layers that are separated from one another by a non-magnetic, electrically conductive intermediate layer as will be described in more detail below. The substrate for the current sensor formed of semiconductor chip 10 and support layer 11 is designated 10,11 in FIGS. 2A, 2B, 2C and 2E as insulating layer 11 and semiconductor chip 10 are not distinguished from one another in those figures. A portion of just layer 11 is shown in the higher resolution drawing of FIG. 2D. Typically, layer 11 is formed by the silicon nitride to a thickness of about 10,000 Å.

Thereafter, the "sandwich" structure mentioned above is provided on layer 11 with each of the ferromagnetic thin-film layers and the intermediate layer being provided through sputter deposition as the basis for forming the magnetoresistive circuit resistor serving as the current sensor. This multilayer structure will have a sheet resistivity of approximately 13 Ω/□, or higher, and will exhibit a giant magnetoresistive effect exceeding five percent along with a saturation field of approximately 40 Oe.

In this structure, the first layer provided is a composite ferromagnetic thin-film layer sputter deposited onto nitride layer 11 with the result shown in FIG. 2D, a first stratum, 12, of this composite ferromagnetic thin-film layer being formed of an alloy of 65% nickel, 15% iron and 20% cobalt to a thickness of 40 Å which will have a magnetic saturation induction typically of about 10,000 Gauss. The deposition of this layer occurs in the presence of an external magnetic field in the plane of the film oriented along a direction parallel to the plane of the figure which results in the film having a face-centered cubic structure. This fabrication field will leave the easy access directed along the plane of the figure. A second stratum, 13, is also provided in a sputter deposition step in the presence of a similar fabrication magnetic field. The second stratum is formed of 5% iron and 95% cobalt to a thickness of 15 Å resulting in this material having a magnetic moment of approximately 16,000 Gauss which is a value higher than that of the magnetic moment of first stratum 12. This higher magnetic moment material is provided adjacent the intermediate layer next to be formed to obtain a greater giant magnetoresistive effect, but lower moment stratum 12 is provided to keep the resulting current sensor more sensitive to smaller fields than it would be in its absence.

Thereafter, an intermediate layer, 14, is provided by sputter deposition onto layer 13, this intermediate layer being electrically conductive but nonmagnetic. Layer 14 is typically formed of copper to a thickness of 35 Å. The provision of layer 14 is followed forming a second composite ferromagnetic thin-film layer that is provided on layer 14, and its structure matches that of the first composite layer comprising strata 12 and 13, except for being in reverse order, because of the use of the same deposition steps. As a result, the stratum having the greater magnetic moment is again adjacent to layer 14 and the lesser magnetic moment stratum is provided thereon. Since the strata are otherwise the same, they have been designated in FIG. 2D as 13' and 12' in corresponding to strata 13 and 12.

After completing this "sandwich" structure, a 200 Å layer of tantalum or tantalum nitride is sputter deposited on stratum 12' to passivate and protect stratum 12' below, and to allow electrical interconnections thereto for circuit purposes. The resulting layer, 15, of tantalum or tantalum nitride, because of its conductivity, leads to the occurrence of some shunting away of current from the rest of the current sensor to thereby provide effective reduction of the giant magnetoresistive effect achieved by the so constructed current sensor. Layer 15 is shown in broken form in FIG. 2D because of its significantly greater thickness compared to the ferromagnetic composite layers and the non-magnetic intermediate layer.

Similarly, a further layer, 16, deposited on layer 15, is shown in broken form in FIG. 2D because of its relatively greater thickness of 100 Å. Layer 15 is first sputter cleaned which removes around 75 Å thereof. Layer 16 is a sputter deposited on cleaned layer 15 as a chrome silicon layer with 40% chrome and 60% silicon to serve as an etch stop for the subsequent etching of a milling mask layer to be provided thereover.

Thus, another layer of silicon nitride is sputter deposited on layer 16 to a depth of 1000 Å to be used as a milling mask, but this layer is not shown in FIG. 2D because its remnants will be incorporated in a further insulating layer to be provided later. On this silicon nitride mask layer, photoresist is deposited and patterned in such a way as to form an etching mask for leaving a masking pattern on the silicon nitride mask layer after etching. This last pattern is to result, after milling therethrough, in a serpentine resistor structure to serve as the current sensor with interconnection extensions extending therefrom for interconnecting this resistor into the device circuit network. Reactive ion etching is used with the patterned photoresist to remove the exposed portions of the silicon nitride mask layer down to chrome silicone layer 16 serving as an etch stop. The remaining portions of the silicon nitride layer serve as the above mentioned milling mask for the subsequent ion milling step which removes the exposed portions of chrome silicon layer 16 and then the now exposed portions of the second composite ferromagnetic thin-film layer formed as strata 13' and 12', then the now exposed portions of intermediate nonmagnetic layer 14, and then the now exposed portions of the first composite ferromagnetic thin-film layer formed as strata 13 and 12 down to silicon nitride layer 11.

The resulting current sensor and interconnection structure, 17, is shown as a single layer structure where it appears in the layer diagram figures, other than in FIG. 2D, rather than the multilayer structure that it is because of the larger scale used in those figures. Thus, in this single layer form, the resulting current sensor and interconnection structure 17 is shown in both FIGS. 2B and 2C. Portions of this structure can also be seen in the plan views of FIGS. 1A and 1B, and the structure is designated by numeral 17 in those figures also. The easy axes of the ferromagnetic thin-film composite layers are perpendicular to the direction of extent of the longest segments of the current sensor in structure 17.

Following completion of current sensor and interconnection structure 17, an insulating layer, 20, of 10,000 Å of silicon nitride or more is provided by sputter deposition over sure 17 (including over the remnants of the silicon nitride milling layer which are shown combined in this insulating layer in FIGS. 2A, 2B, 2C and 2E) and on the exposed portions of silicon nitride layer 11. The quality and thickness of insulating layer 20 are quite important as they determine the voltage withstanding capability of that layer between voltages appearing on the input conductor to be provided for carrying the signal currents and current sensor and interconnection structure 17 as will be described further below. Insulator layer 20, of good quality and a thickness of 10,000 Å, will provide a breakdown voltage exceeding 1000V, and thicker layers can be used to increase the ability of insulator layer 20 to withstand substantially greater voltages.

Two separate etches of layer 20 are performed after its provision. In the first, photoresist is patterned thereover to provide openings therein where openings are desired in insulator layer 20 for forming electrical interconnections with structure 17. Reactive ion etching is used to provide openings, 21, in layer 20 to expose layer 16 of structure 17 as shown in FIG. 2C. In the second etching step, photoresist again is provided in a pattern having openings therein where openings, 22, are to be formed in insulation layer 20, in insulation layer 11, and in any other layers in semiconductor chip substrate 10 required to expose interconnection pads, 23, therein for connection of current sensor and interconnect structure 17 to circuits connected to pads 23 in the monolithic integrated circuit forming semiconductor chip 10. A portion of a pad 23 is shown in FIG. 2C with the remainder of the interconnection circuitry and the electronic circuits electrically connected thereto in chip 10 not being shown.

With these openings in insulator 20 completed, a first layer, 24, of metal interconnections is provided beginning with sputter cleaning to remove approximately half of the thickness of the exposed portions of chrome silicon layer 16. This cleaning is followed by sputter depositing a layer of aluminum alloyed with 2% copper which fills in openings 21 and 22 but which is otherwise supported on the upper surface of insulator layer 20. Layer 24 is conductively connected to the "sandwich" structure portion of structure 17 through filling in openings 21 so as to be conductively connected thereto through the remaining portions of chrome silicon layer 16 and tantalum layer 15, and is further connected to 20 pads 23 directly through the filling in of openings 22. Photoresist is provided over layer 24 and patterned to expose unwanted portions thereof which portions are subsequently removed by reactive ion etching to result in the desired interconnection sure for first metal layer 24.

The removal of unwanted portions of layer 24 results in several structures, the most important of which is the majority of the input conductor through which signal currents are conducted, this major portion being in the form of a six turn coil, 25, shown in FIG. 1A following something of a hexagonal path. Portions of coil 25 are indicated by the same numerical designation in FIGS. 1B, 2A and 2B. A coil interconnection portion, 25', is formed of the same first layer interconnection metal and leads from the right-hand side of coil 25 in FIG. 1A down to an external interconnection pad arrangement, 26, which comprises a first layer interconnection metal base having a second interconnection layer metal portion provided thereon as will be described further below. The other end of coil 25 is also connected to an interconnection pad arrangement, 27, as will be further described below. In addition, interconnection paths, 28 and 29, are extended from the ends of interconnection extensions in current sensor and interconnection structure 17 to interconnection pads, 30 and 31, also shown in FIG. 1A. Interconnection path 28 is also designated by the same numerical designation in FIG. 2E.

First metal interconnection layer 24 is typically deposited in a thickness from 5000 to 7500 Å to assure that some of the resulting conductive structures can accept current densities of up to 5 mA/$\mu$m in the current conductor carrying the signal currents without the occurrence of excessive heating or electromigration. Alternative metals can be used, such as gold or copper or tungsten for this first layer of interconnections if desired. As further alternatives, the number of turns in coil 25 and both the thickness and width of the conductors forming that coil can be varied to affect the impedance it presents to sources of input currents. Additional circuit structures can be fabricated therewith for impedance adjustment reasons.

The completion of coil 25 and interconnection paths 28 and 29 is followed by depositing another layer of typically 7500Å of silicon nitride thereover, and over the exposed portions of layer 20, to form a further insulating layer, 35. Photoresist is deposited over layer 35 with patterned openings therein below which holes are to be provided in layer 35 to accommodate interconnections being made by a second layer of interconnection metal to be described below. Reactive ion etching is used to form these openings, 36, in layer 35 as shown in FIGS. 2A and 2E.

On second insulator layer 35, a further metal deposition is made to form a second metal interconnection layer, 37, again of aluminum alloyed with 2% copper to cover that layer and fill in openings 36. The filling in of openings 36 by metal layer 37 directly connects that layer to the exposed parts of the structures formed from the remaining portions of layer 24 as is shown in FIGS. 2A and 2E. Layer 37 is typically deposited to a thickness of 3500 Å. Photoresist is spread thereover with openings therein where the unwanted portions of layer 37 are to be eliminated, and reactive ion etching is undertaken to provide this elimination of layer 37 portions. The structures that result from this elimination are shown in FIG. 1A including a lead-out, 38, which extends from the interior end of coil 25, as seen in FIG. 2A, over insulator 35 and thus over coil 25 to pad 27. Remaining portions of second metal layer 37 are also used to form metal bases, 39, for pads 26, 30 and 31 that also transfer signals up from remaining portions of first metal layer 24 such as is shown in FIG. 2E. No dashed lines are attempted to show which layers are covered by other layers in FIG. 1A.

A further insulator layer, 40, is provided by sputter depositing 7500 Å of silicon nitride over the remaining portions of metal layer 37 and the exposed portions of insulator layer 35. Insulator layer 40 serves as a passivation and protection layer for the device structures therebelow, and also serves as a base for a permeable mass to be provided to serve as a flux shield and concentrator over the portion of coil 25 that is above the current sensor portion of current sensor and interconnection structure 17.

The structure for such a concentrator is begun by depositing a ferromagnetic thin-film initiation layer, 41, which serves as an electrode for subsequent electroplating steps and as an adhesion layer for adhering the next layer of metal to be provided thereon to insulator layer 40. Photoresist is then deposited and patterned to provide an opening therein over the portion of layer 41 above a part of the current sensor in current sensor and interconnection structure 17. Into this opening, there is then electroplated 20,000Å of gold to serve as a stress relief layer, 42, for the permeable material mass to be subsequently deposited thereon. The photoresist that was applied after the deposition of the initiation layer is then removed, and a new layer of photoresist is applied defining an opening above stress relief layer 42. A permeable mass, 43, is then formed in this latest opening by electroplating, the mass being formed of a permeable material alloy comprising 80% iron and 20% nickel deposited to a thickness of 14 microns.

The photoresist guiding the plating of layer 43 is then removed. The device is dipped in an acid bath formed of a mixture of phosphoric, acetic and nitric acids to remove initiation layer 41 from the portions thereof not under layers 42 and 43. The resulting permeable mass shield and concentrator is shown in FIG. 2B. A further layer of photoresist is then deposited on the device with openings therein over interconnection pads 26, 27, 30 and 31 where via openings, 44, are to be provided in layer 40. Reactive ion etching is used to provide such openings as seen in FIG. 2E which allow for subsequent interconnections to exterior circuits, usually through ball bonding wires to bases 39 therethrough. The wafers in which the devices just described are fabricated are then ready for wafer testing, separating the individual devices into separate chips and packaging them.

A basic mode of operation of the signal isolator device shown in FIGS. 1A, 1B, 2A, 2B, 2C, 2D and 2E would be to provide a constant current through current sensor and interconnection structure 17 while monitoring the voltage that occurs across that structure. This voltage will be a function of the magnitude of the signal current introduced through coil 25 because of the magnetoresistive nature of structure 17. The measured voltage is thus an indication of the electrical resistance of current sensor and interconnection structure 17 as well as the magnitude of the current flowing in coil 25, at least for currents in coil 25 having sufficiently small frequency content.

Figure 3:
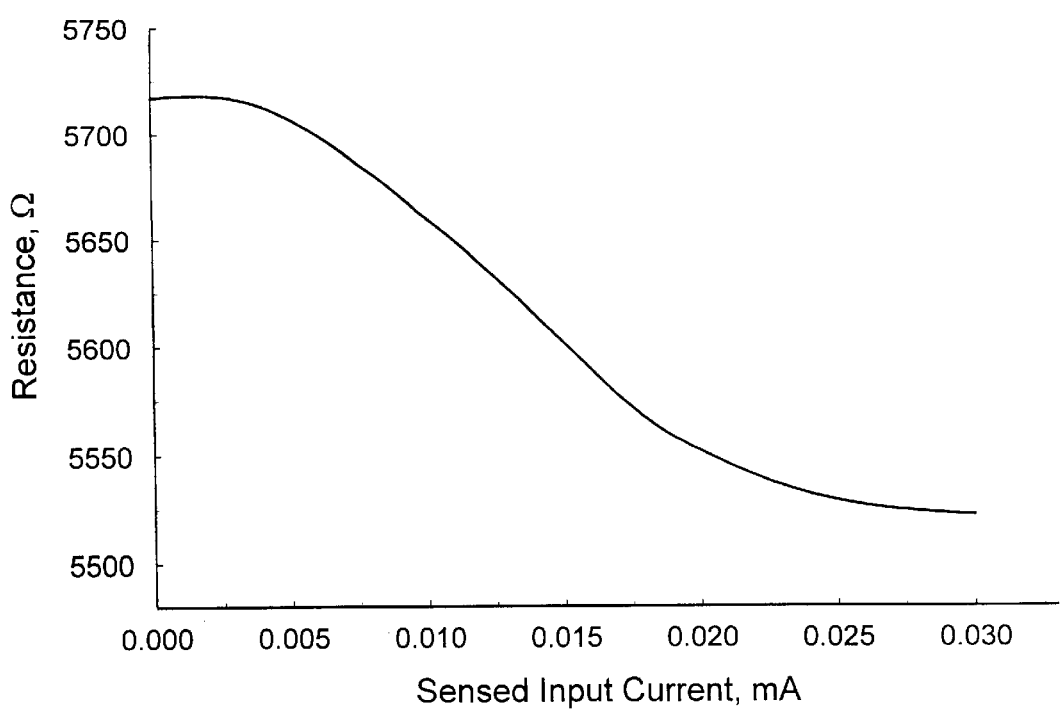
FIG. 3 shows a characteristic of a structure like that represented in FIGS. 1 and 2.

The resistance measured for structure 17 is found to be nearly symmetrical about zero signal currents in coil 25 so that the resistances found for both positive and negative currents through that coil of the same magnitude are approximately equal to one another. However, the resistance of structure 17 is found to be a nonlinear function of the magnitudes of the signal currents in coil 25 as can be seen in FIG. 3. This nonlinearity is thought to result from the structural arrangement of the device described in these figures, and from the magnetic properties of the "sandwich" structure forming the current sensor in current center in interconnection structure 17 as well as the magnetic properties of the material in shield and concentrator layer 43. In addition, for sufficiently large signal currents in coil 25, thermal effects will also affect the resistance of current sensor and interconnection structure 17 because of temperature coefficients of that structure typically having values around 1400 ppm/°C. The frequency range over which operations of the device are typically unaffected by frequencies up to the tens or hundreds of megaHertz.

Signal isolators like that described in FIGS. 1A, 1B, 2A, 2B, 2C, 2D, and 2E will exhibit representations at its output for the currents flowing in coil 25 that are limited in accuracy because of the nonlinearity just mentioned. This performance limitation can be substantially reduced through the use of two or more such signal isolators in an input circuit to allow such added isolators to aid in countering the effects of the nonlinearity exhibited by the initial isolator. One such input circuit for accomplishing this result is the use of input-output current tracker, 50, shown in FIG. 4.

Current tracker 50 is operated between a first terminal, 51, suited for connection to a supply of positive voltage and a further terminal, 52, suited for connection to a supply of negative voltage. Another terminal, 53, is connected to provide a reference voltage, or ground reference voltage, with respect to which the voltages on terminals 51 and 52 are supplied.

Figure 4:
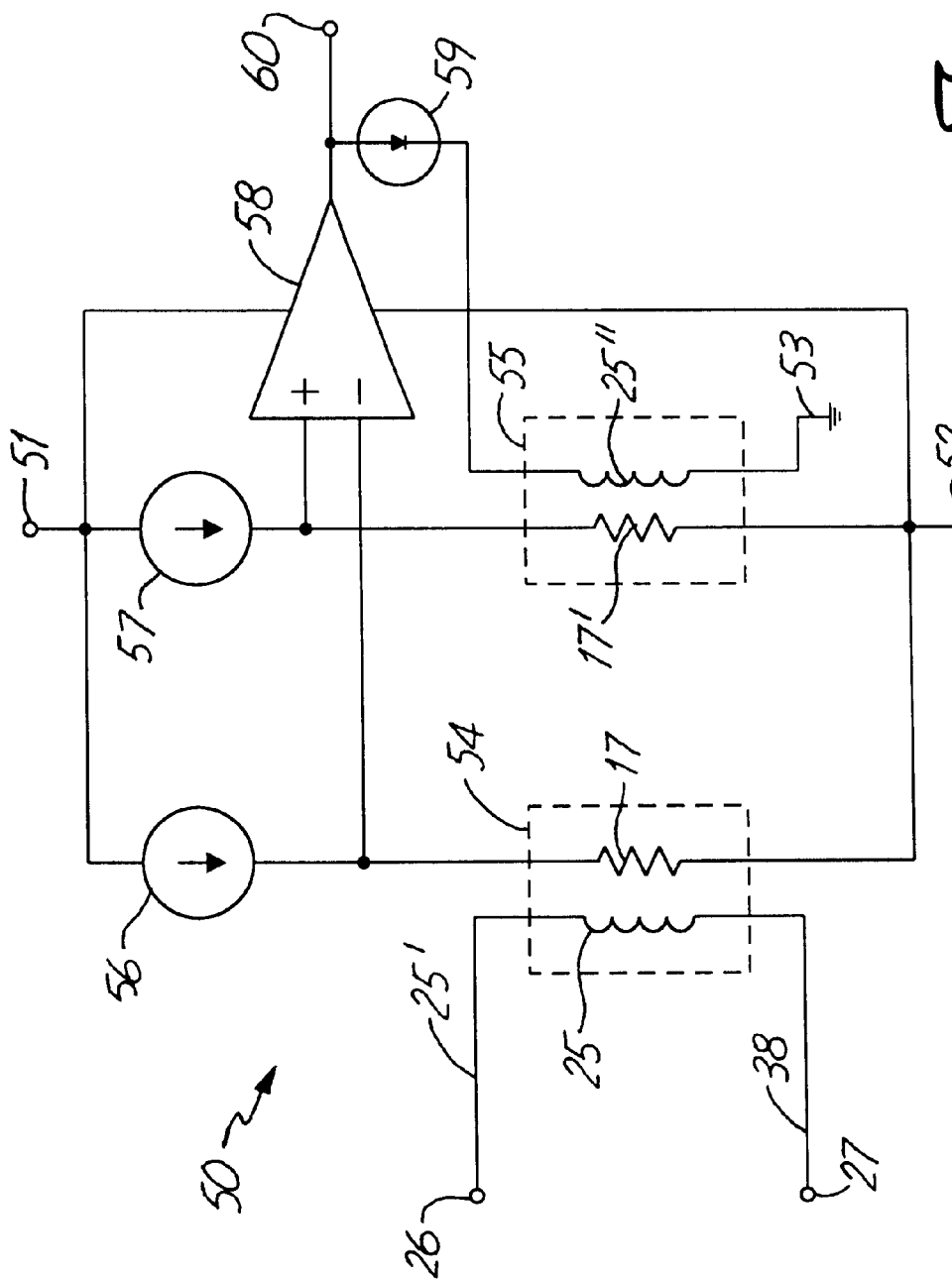
FIG. 4 shows a circuit schematic diagram of a circuit embodying the present invention.

Tracker 50 has a pair of input terminals corresponding to interconnection pad arrangements 26 and 27 of FIG. 1A, and those designations have been used again in FIG. 4 for these input terminals. Similarly, coil 25 from FIG. 1A is interconnected between terminals 26 and 27, and is again designated 25 in FIG. 4. Coil interconnection portion 25' and coil lead-out 38 of FIG. 1A are marked with those designations for the equivalent conductor portions shown in FIG. 4. Finally, current sensor and interconnection structure 17 from FIG. 1A and FIG. 1B is marked as an equivalent resistor in FIG. 4. Coil 25 and current sensor and interconnection structure 17 are shown together in a dashed line box, 54, to show they together form a magnetoresistive effect based current sensor arrangement.

The remaining portions of current tracker 50 in FIG. 4 differ from what is shown in FIGS. 1A and 1B beginning with the addition of a further magnetoresistive effect based current sensor arrangement, 55, intended to be fabricated to match the structure of magnetoresistive effect based current sensor 54. As a result, the magnetoresistive member of sensor 55 is designated 17' and the coil member is designated 25" in the dashed line box representing magnetoresistive effect based current sensor 55.

Magnetoresistive members 17 and 17' of sensors 54 and 55, respectively, are each supplied a constant current during operation by a corresponding one of a pair of constant current sources, 56 and 57. These constant current sources are intended to be fabricated to be matched to one another in structure so that the current supplied by each closely matches that supplied by the other. Current source 56 is connected between terminal 51 and magnetoresistive member 17, and current source 57 is connected between terminal 51 and magnetoresistive member 17'. Each of magnetoresistive members 17 and 17' have the opposite ends thereof connected to terminal 52 to form a half bridge circuit having each bridge circuit member supplied by a corresponding constant current source, and with each member subject to having its resistance value changed by currents flowing in the coil adjacent thereto.

An operational amplifier, 58, has its differential inputs each connected to the corresponding junction of one of the current sources and magnetoresistive members. Thus, the inverting input of operational amplifier 58 is connected to the junction of current source 56 and magnetoresistive member 17. The non-inverting input of operational amplifier 58 is connected to the junction of current source 57 and magnetoresistive resistive member 17'. The output of operational amplifier 58 is connected to the anode of a diode, 59, and to an output, 60, of current tracker 50. In addition, operational amplifier 58 is connected to both terminals 51 and 52 at its corresponding positive and negative voltage supply terminals. Operational amplifier 58 is a differential input, single output, high gain, high input impedance, low output impedance amplifier operated in the circuit of FIG. 4 as a transconductance amplifier.

Diode 59 has its cathode connected to coil member 25" of sensor 55. The opposite side of coil member 25' is connected to ground terminal 53. Diode 59 is used to restrict current flow through coil member 25" to flowing into ground, and not flowing from ground through that coil. This is done because of the symmetry in the resistance characteristic of magnetoresistive members 17 and 17' versus the current in the adjacent coil, a symmetry which could lead to a noise pulses forcing the circuit to reach a stable state for current flows in either direction through coil member 25" despite a current flow in only one direction in input coil member 17.

Input currents to be sensed and tracked by current tracker 50 are supplied to input terminal 26 of tracker 50 to result in that current being established through coil 25 of sensor 54 and out of terminal 27. Such a current causes a magnetic field to form thereabout, and so about magnetoresistive member 17 in sensor 54, to effectively change the resistance thereof. Such a resistance change causes a change in the voltage present at the junction of member 17 and current source 56, and so leads to a difference in voltages between that voltage occurring at the junction of member 17 and current source 56 and the voltage occurring at the junction of magnetoresistive member 17' and current source 51.

This voltage difference simultaneously also occurs between the differential inputs of operational amplifier 58 serving as a transconductance amplifier, or voltage-to-current inverter, and so is amplified by that amplifier to supply a corresponding output current therefrom through diode 59 into coil member 25". Such a current causes a magnetoresistive effect based change in the resistance of member 17' in a direction tending to null out the differential voltage initially appearing between the input terminals of operational amplifier 58 due to the input current introduced at terminal 26.

Since magnetoresistive members 17 and 17' in sensors 54 and 55, respectively, are fabricated so as to be well matched to one another, the intended result is that the change in resistance in member 17', due to the current in coil 25", should just equal that change that occurred in member 17 due to the input current introduced in coil 25. Thus, such a balancing of resistance changes should lead to no significant voltage difference remaining between the differential input terminals of operational amplifier 58 when the current at its output supplied to coil 25" just matches that introduced through terminal 26. Hence, an output current is supplied at the output of operational amplifier 58 to coil 25" that is essentially equal to the current established through terminal 26 even though magnetoresistive members 17 and 17' are not necessary linear functions of the currents flowing in coil members 25 and 25'. In these circumstances, the output voltage of operational amplifier 58 supplied to output terminal, 60, is a measure of the current flowing in input terminal 26.

This desired result of matched input and output currents, however, depends on the closeness of the matching of the characteristics of magnetoresistive members 17 and 17' of sensors 54 and 55, and the closeness of matching of the currents supplied by current sources 56 and 57. The presence of nonlinearities in the response of magnetoresistive member 17 and 17' to currents in coils 25 and 25', respectively, does not alter this desired outcome if members 17 and 17' are well matched, including in their nonlinearity aspects, but such nonlinearities, poorly matched, can result in a less desirable outcome.

This can be seen in the equations characterizing the behavior of current tracker 50 which can be found based on setting the output current in coil 25" equal to the amplified difference in voltages at the inputs of amplifier 58 as determined by the values of the resistance characteristic expressions for magnetoresistive members 17 and 17', the currents supplied by current sources 56 and 57, and the input current, yielding $$I_{out} = G[I_{57}(R17'K_0 + R17'K_1 I_{out} + R17'K_2 I_{out}^2) - I_{56}(R17K_0 + R17K_1 I_{in} + R17I_{in}^2)].$$

In this expression $I_{out}$ represents the output current of amplifier 58 established at its output through coil 25", and $I_{in}$ represents the input current supplied to terminal 26 to pass through coil 25. The currents $I_{56}$ and $I_{57}$ are the currents established by the corresponding ones of current sources 56 and 57. The gain constant G represents the transconductance of operational amplifier 58 between its output and its differential inputs.

Each of magnetoresistive members 17 and 17' are modeled in the foregoing equation as nonlinear resistors to second order with respect to the currents in the corresponding ones of coils 25 and 25". The expressions for these models are $$R_{17}=R17K_0+R17K_1I_{in}+R17K_2I_{in}^2,$$

$$R_{17'}=R17'K_0+R17'K_1I_{out}+R17'K_2I_{out}^2.$$

That is, magnetoresistive member 17 and 17' are modeled as nonlinear resistors by power series in the current sensed by them to the second order of those currents. The coefficients in these expressions for the zeroth power are $R17K_0$ and $R17'K_0$, respectively, for the first power are $R17K_1$ and $R17'K_1$, respectively, and for the second power are $R17K_2$ and $R17'K_2$, respectively. A best fit to the characteristic shown in FIG. 3 for a magnetoresistive member such as member 17 and 17' using a second order polynomial regression gives an expression for these magnetoresistive members of $$R_{17}, R_{17'} = 5742 - 10,060 I_{in} + 72,710 I_{in}^2.$$

This equation can be solved for $I_{out}$ provided from the output of amplifier 58 through coil 25" in terms of the input current $I_{in}$ to be sensed supplied to terminal 26 to pass through coil 25 and the circuit parameters based on the circuit components and topology. Assuming G to be sufficiently large, the result is $$I_{out} = -\frac{1}{2}\frac{R17'K_1}{R17'K_2} - \sqrt{\frac{1}{4}\left(\frac{R17'K_1}{R17'K_2}\right)^2 + \frac{I_{56}R17K_0 - I_{57}R17'K_0}{I_{57}R17'K_2} + \frac{I_{56}}{I_{57}}\frac{R17K_2I_{in}^2 + R17K_1I_{in}}{R17'K_2}}$$

The magnetoresistive members resistance characteristics coefficients can be valued from the second order best fit equation given above. Making choices for the current values from current sources 56 and 57 then allows the preceding expression for $I_{out}$ to be evaluated versus values of $I_{in}$.

Such evaluations of $I_{out}$ as a function of quickly show that the degree of matching between $I_{out}$ and $I_{in}$ for various values of $I_{in}$ depends strongly on the quality of the matching of the parameters of the magnetoresistive members 17 and 17'. If there is a mismatch in the nominal resistance values of magnetoresistive members 17 and 17' in the absence of any currents in coils 25 and 25", that is, a mismatch in the values of $R17K_0$ and $R17'K_0$, a significant difference appears between $I_{out}$ and $I_{in}$ as accounted for by the second term under the radical in the last expression for $I_{out}$. This difference persists until the third term under the radical, depending on $I_{in}$, gains a magnitude sufficient that the magnitude of the second term becomes relatively small. Hence, the match between $I_{out}$ and $I_{in}$ is relatively poor for relatively small values of $I_{in}$ in the presence of a mismatch in the nominal resistances of members 17 and 17'. The match between $I_{out}$ and $I_{in}$ improves strikingly for sufficiently greater values of $I_{in}$.

The match between $I_{out}$ and $I_{in}$ is further improved by a close matching of the coefficients of the second order terms in the second order representations for magnetoresistive members 17 and 17', $R17K_2$ and $R17'K_2$, as can be seen in the third term under the radical in the last expression for $I_{out}$. This match is further improved if the coefficients for the linear terms, here $R17'K_1$, in the second order representation for magnetoresistive members is significantly less than the coefficient for the second order terms in those representations.

In view of the importance of matching between the resistance characteristics as a function of adjacent coil current for magnetoresistive members 17 and 17' of sensors 54 and 55, respectively, in current tracker 50, there will in some instances be a need for substantial efforts to assure good matching of these characteristics or to counteract the effects of any mismatch. One standard way of improving the match would be to adjust the resistance value of one of these magnetoresistive members to more closely match that of the other after fabrication by use of well known resistor trimming techniques. Another possibility is to swap the positions of the current sources in the circuit of FIG. 4 during operation sufficiently often to effectively average the results obtained in each of those situations in providing the circuit output to overcome mismatches in those current sources. Such swapping can be provided through the use of complementary metal-oxide-semiconductor field-effect transistors as analog transmission gates which would be integrated in the same monolithic integrated circuit as current sources 56 and 57 and magnetoresistive members 17 and 17'.

Figure 5:
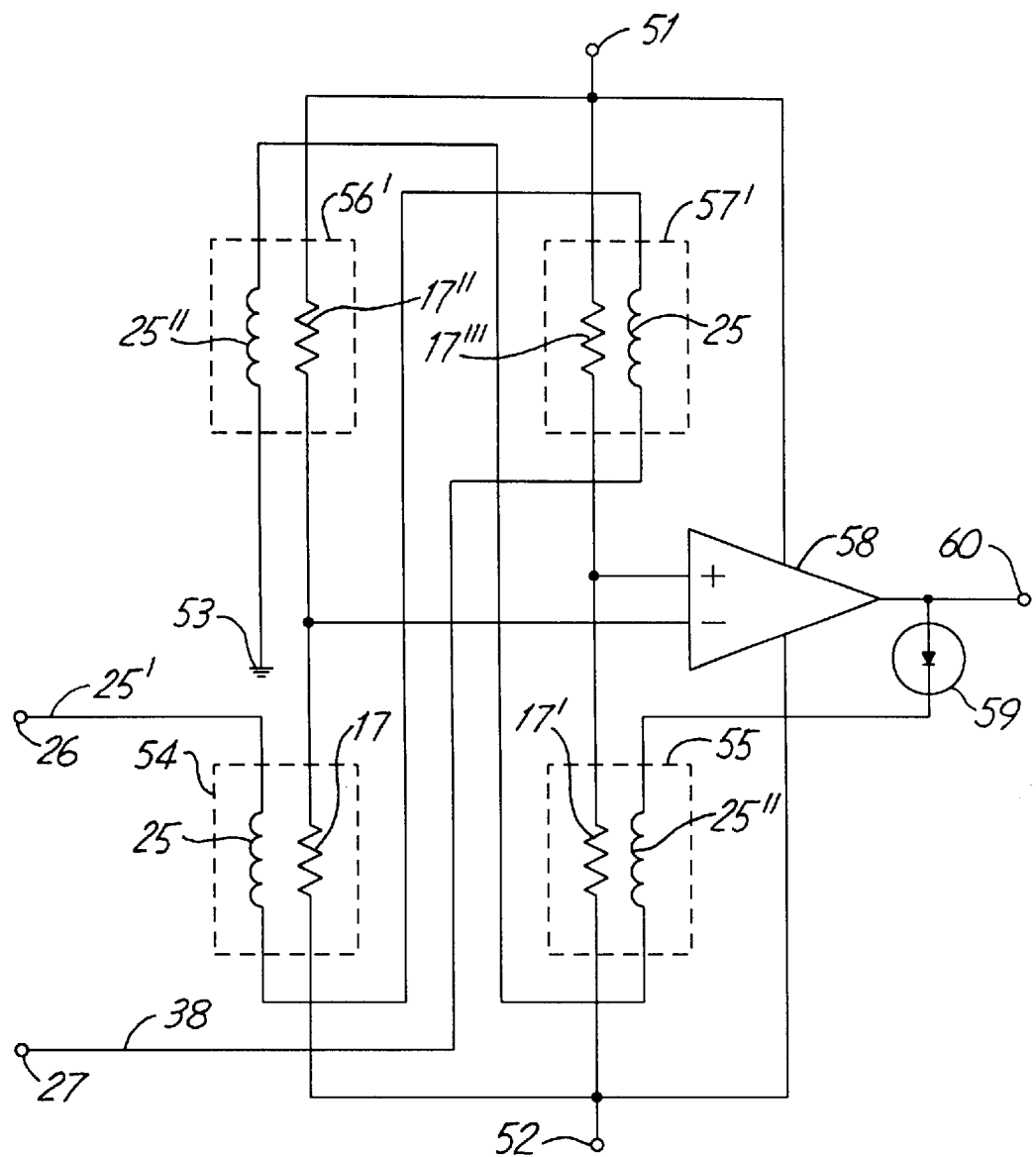
FIG. 5 shows a circuit schematic diagram of an alternate circuit embodying the present invention.

A further possibility would be to go to a full bridge circuit as is used in the circuit shown in FIG. 5. There, two further magnetoresistive effect based current sensor arrangements, 56' and 57', are used in place of current sources 56 and 57 of FIG. 4 and would, of course, also supply current to sensors 54 and 55. The input current in the circuit of FIG. 5 supplied to terminal 26 passes through both magnetoresistive member 17 and magnetoresistive member 17', while the output current from amplifier 58 passes through both magnetoresistive member 17' and magnetoresistive member 17". The use of two further magnetoresistive members, 17" and 17''', in sensors 56' and 57', respectively, will double the signal voltage at the input of operational amplifier 58 in response to an input current supplied to terminal 26. This increase will reduce any offset currents due to magnetoresistive member mismatch, and improve linearity because of being operated at more nearly identical currents due to such reduced offsets.

Figure 6:
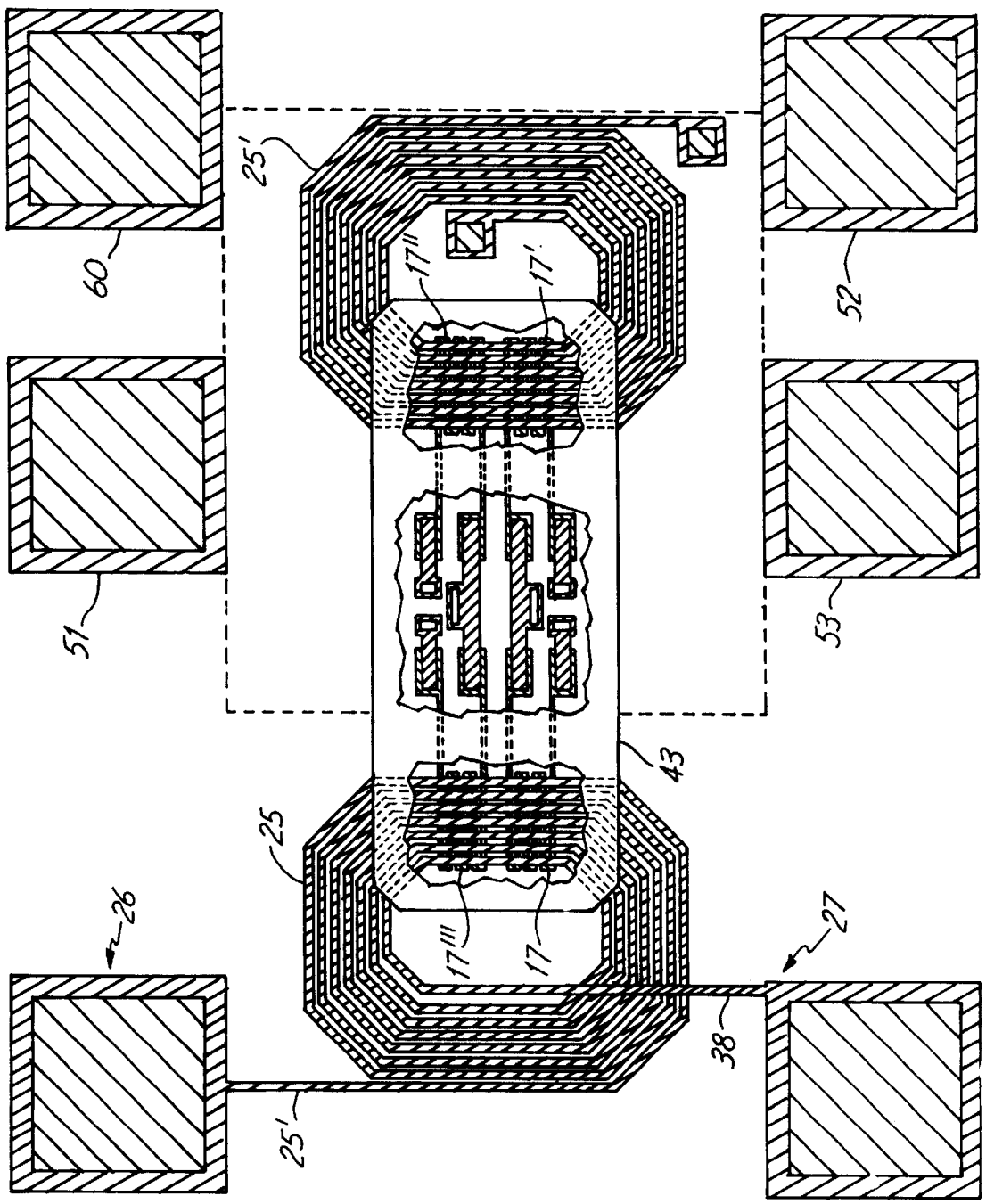
FIG. 6 represents a plan view of a portion of an alternate monolithic integrated circuit structure embodying the present invention.

A possible layout in a monolithic integrated circuit chip for the circuit of FIG. 5 is shown in FIG. 6 for the magnetic interacting portions of that circuit which are again provided in the chip above the electronic circuits formed in the semiconductor material substrate. These electronic circuit portions of that circuit are contained in the substrate within the dashed line rectangle shown there to minimize interactions with the input current. The same numerical designations are used in the structural elements of FIG. 6 as are used with the corresponding circuit elements in the circuit of FIG. 5. The construction of these elements is substantially that used for the elements shown in FIGS. 1 and 2.

Although the present invention has been described with reference to preferred embodiments, workers skilled in the art will recognize that changes may be made in form and detail without departing from the spirit and scope of the invention.

What is claimed is:

1. A current tracker for providing an output current of a magnitude substantially following that of an input current supplied to an input thereof, said current tracker comprising:

a bridge circuit suited for electrical connection to a source of electrical energization, said bridge circuit comprising a plurality of magnetoresistive members each being a magnetoresistive effect based current sensor and with there being a plurality of sensed signal conductors each adjacent to a corresponding said magnetoresistive member positioned to be in those magnetic fields arising from any currents therein including a said sensed signal conductor electrically connected to said input and electrically isolated from any direct electrical interconnection with said bridge circuit, there being a further said sensed signal conductor adjacent a corresponding said magnetoresistive member without any magnetically permeable material interposed therebetween; and a differential input amplifier having a plurality of inputs electrically connected to said bridge circuit and an output electrically connected to said further sensed signal conductor to supply said output current thereto.

2. The apparatus of claim 1 wherein said bridge circuit also contains a plurality of current supplies.

3. The appartus of claim 2 wherein said magnetoresistive members are each a "sandwich" structure having a pair of ferromagnetic lagers with a nonmagnetic layer therebetween.

4. The apparatus of claim 1 wherein said bridge circuit contains at least four magnetoresistive effect based current sensors as said magnetoresistive members in said plurality thereof.

5. The apparatus of claim 4 wherein said magnetoresistive members are each a "sandwich" structure having a pair of ferromagnetic layers with a nonmagnetic later therebetween.

6. The apparatus of claim 4 wherein said sensed signal conductor electrically connected to said input is adjacent to two of said magnetoresistive members without direct electrical connection to one another, and said sensed signal conductor supplied with said output current by said differential amplifier is adjacent another two of said magnetoresistive members without direct electrical connection to one another.

7. The apparatus of claim 1 where there is a diode electrically connected between said differential amplifier output and said sensed signal conductor supplied with said output current by said differential amplifier.

8. A current tracker for providing an output current of a magnitude substantially following that of an input current supplied to an input thereof, said current tracker comprising:

a bridge circuit suited for electrical connection to a source of electrical energization, said bridge circuit comprising a plurality of magnetoresistive members supported on a substrate each being a magnetoresistive effect based current sensor and with there being a plurality of sensed signal conductors supported on said substrate each adjacent to a corresponding said magnetoresistive member positioned to be in those magnetic fields arising from any currents therein including a said sensed signal conductor electrically connected to said input and electrically isolated from any direct electrical connection with said bridge circuit on said substrate, there being further said sensed signal conductor adjacent a corresponding said magnetoresistive member; and a differential input amplifier having a plurality of inputs electrically connected to said bridge circuit and an output electrically connected to said further sensed signal conductor to supply said output current thereto.

9. The apparatus of claim 8 wherein said bridge circuit also contains a plurality of current supplies.

10. The apparatus of claim 9 wherein said magnetoresistive members are each a "sandwich" structure having a pair of ferromagnetic layers with a nonmagnetic layer therebetween.

11. The apparatus of claim 8 wherein said bridge circuit contains at least four magnetoresistive effect based current sensors as said magnetoresistive members in said plurality thereof.

12. The apparatus of claim 11 wherein said magnetoresistive members are each a "sandwich" structure having a pair of ferromagnetic layers with a nonmagnetic layer therebetween.

13. The apparatus of claim 11 where there is a diode electrically connected to said input is adjacent to two of said magnetoresistive members without direct electrical connection to one another, and said sensed signal conductor supplied with said output current by said differential amplifier is adjacent another two of said magnetoresistive members without direct electrical connection to one another.

14. The apparatus of claim 8 where there is a diode electrically connected between said differential amplifier output and said sensed signal conductor supplied with said output current by said differential amplifier.

15. A signal isolator for providing at an output thereof representations of input currents provided therein from a source of such currents, said signal isolator comprising:

an input conductor suited for conducting said input currents therethrough and supported on a substrate;

a bridge circuit suited for electrical connection to a source of electrical energization, said bridge circuit comprising a pair of series circuit members electrically connected in parallel with one another supported on a substrate with each series circuit member having a magnetoresistive member electrically connected in series with a current value controller having an internal impedance exceeding that of said magnetoresistive member, said magnetoresistive members each being formed of magnetoresistive, anisotropic, ferromagnetic thin-film layers at least two of which are separated from one another by a nonmagnetic layer positioned therebetween with at least one of said magnetoresistive members being adjacent to, yet spaced apart from, said input conductor to thereby be electrically isolated from any direct circuit interconnection therewith but positioned so that said magnetoresistive member is in those magnetic fields arising from said input currents; and a differential input amplifier having a pair of inputs each electrically connected to both said magnetoresistive member and said current value controller in a corresponding one of said bridge circuit series circuit members.

16. The apparatus of claim 15 further comprising a diode electrically connected between an output of said differential amplifier and an output conductor supported on said substrate adjacent to, yet spaced apart from, one of said magnetoresistive members substantially outside those magnetic fields arising from said input currents.

17. The apparatus of claim 15 wherein said substrate further comprises a monolithic integrated circuit structure containing electronic circuit components of which at least one is electrically connected to said bridge circuit.

18. A signal isolator for providing at an output thereof representations of input currents provided therein from a source of such currents, said signal isolator comprising:

an input conductor suited for conducting said input currents therethrough and supported on a substrate;

a first magnetoresistive member suited for electrical connection to a source of electrical energization and supported on said substrate adjacent to, yet spaced apart from, said input conductor to thereby be electrically isolated from any direct electrical connection therewith on said substrate but positioned to be in those magnetic fields arising from said input currents, said first magnetoresistive member being formed of magnetoresistive, anisotropic, ferromagnetic thin-film layers at least two of which are separated from one another by a nonmagnetic layer positioned therebetween; and an amplifier having an input electrically connected to said first magnetoresistive member.

19. The apparatus of claim 18 further comprising a second magnetoresistive member suited for electrical connection to a source of electrical energization and supported on said substrate electrically connected to said a first magnetoresistive member, said second magnetoresistive member being formed of magnetoresistive, anisotropic magnetic thin-film layers at least two of which are separated from one another by a non-magnetic layer positioned therebetween, said amplifier being a differential input amplifier having a pair of inputs each electrically connected to a corresponding one of said first and second magnetoresistive members.

20. The apparatus of claim 19 further comprising a diode electrically connected between an output of said differential amplifier and an output conductor supported on said substrate adjacent to, yet spaced apart from, said second magnetoresistive member.

21. The apparatus of claim 19 further comprising a bridge circuit suited for electrical connection to a source of electrical energization, said bridge circuit comprising a plurality of magnetoresistive members supported on a substrate in addition to said first and second magnetoresistive members, said magnetoresistive members each being formed of magnetoresistive, anisotropic, ferromagnetic thin-film layers at least two of which are separated from one another by a nonmagnetic layer positioned therebetween.

22. The apparatus of claim 21 further comprising a diode electrically connected between an output of said differential amplifier and an output conductor supported on said substrate adjacent to, yet spaced apart from, one of said magnetoresistive members substantially outside those magnetic fields arising from said input currents.

23. The apparatus of claim 21 wherein said substrate further comprises a monolithic integrated circuit structure containing electronic circuit components of which at least one is electrically connected to said bridge circuit.

24. The apparatus of claim 19 wherein said substrate further comprises a monolithic integrated circuit structure containing electronic circuit components of which at least one is electrically connected to one of said first and second magnetoresistive members.

25. The apparatus of claim 18 wherein said substrate further comprises a monolithic integrated circuit structure containing electronic circuit components of which at least one is electrically connected to said first magnetoresistive member.

\* \* \* \* \*

UNITED STATES PATENT AND TRADEMARK OFFICE
CERTIFICATE OF CORRECTION

PATENT NO. : 6,252,390 B1
DATED : June 26, 2001
INVENTOR(S) : William C. Black Jr. et al.

It is certified that error appears in the above-identified patent and that said Letters Patent is hereby corrected as shown below:

Column 5,
Line 2, after "provide", insert -- an --
Line 55, delete "sure", insert -- structure --

Column 6,
Line 34, delete "sure", insert -- structure --

Column 10,
Line 3, delete "51", insert -- 57 --

Column 13,
Line 12, delete "lagers", insert -- layers --
Line 48, after "being", insert -- a --

Column 14,
Line 1, delete "where there is a diode", insert -- wherein said sensed signal conductor --

Signed and Sealed this

Eleventh Day of June, 2002

*Attest:*

*Attesting Officer*

JAMES E. ROGAN
*Director of the United States Patent and Trademark Office*